US006344383B1

(12) United States Patent
Berry et al.

(10) Patent No.: US 6,344,383 B1
(45) Date of Patent: Feb. 5, 2002

(54) STRUCTURE AND METHOD FOR DUAL GATE OXIDATION FOR CMOS TECHNOLOGY

(75) Inventors: Wayne S. Berry, Essex Junction, VT (US); Jeffrey P. Gambino, Gaylordsville, CT (US); Jack A. Mandelman, Stormville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/421,853

(22) Filed: Oct. 20, 1999

Related U.S. Application Data

(62) Division of application No. 09/173,430, filed on Oct. 15, 1998.

(51) Int. Cl.[7] .......................................... H01L 21/8238
(52) U.S. Cl. ..................... 438/221; 438/218; 438/275; 438/279; 438/424
(58) Field of Search ............................... 438/197, 199, 438/218–221, 275, 279, 424

(56) References Cited

U.S. PATENT DOCUMENTS

| 4,830,975 | A | | 5/1989 | Bovaird et al. |
| 5,011,788 | A | | 4/1991 | Kawaji et al. |
| 5,141,888 | A | | 8/1992 | Kawaji et al. |
| 5,200,348 | A | | 4/1993 | Uchida et al. |
| 5,319,235 | A | | 6/1994 | Kihara et al. |
| 5,468,677 | A | | 11/1995 | Jun |
| 5,567,645 | A | | 10/1996 | Ahn et al. |
| 5,691,217 | A | | 11/1997 | Honeycutt |
| 5,726,093 | A | | 3/1998 | Yoo |
| 5,728,622 | A | | 3/1998 | Yu |
| 5,904,574 | A | * | 5/1999 | Nishijima .................... 438/758 |
| 6,130,172 | A | * | 10/2000 | Fuller et al. ................. 438/783 |
| 6,171,896 | B1 | * | 1/2001 | Jang et al. .................. 438/221 |

FOREIGN PATENT DOCUMENTS

JP         5-109984         4/1993

OTHER PUBLICATIONS

Dah–Bin Kao, et al., "Two–Dimensional Thermal Oxidation of Silicon–II. Modeling Stress Effects in Wet Oxides", IEEE Transactions on Electron Devices, vol. ED–35, No. 1, pp. 25–37 (Jan. 1988).
L. Nesbit, "A 0.6 $\mu m^2$ 256 Mb Trench DRAM Cell With Self–Aligned BuriEd STrap (BEST)", International Electron Devices Meeting 1993, Technical Digest (Cat. No. 93CH3361–3), pp. 627–630.

* cited by examiner

*Primary Examiner*—Long Pham
(74) *Attorney, Agent, or Firm*—Scully, Scott, Murphy & Presser; Eugene I. Shkurko, Esq

(57) ABSTRACT

The present invention provides an integrated circuit which comprises a substrate having a plurality of device regions formed therein, said plurality of device regions being electrically isolated from each other by shallow trench isolation (STI) regions and said plurality of device regions each having opposing edges abutting its corresponding STI region; selected ones of said devices regions having a preselected first device width such that an oxide layer formed thereon includes substantially thicker perimeter regions, along said opposing edges, compared to a thinner central region that does not abut its corresponding STI region; and selected other ones of the device regions having a preselected device width substantially narrower in width than the first device width such that an oxide layer formed thereon includes perimeter regions, along opposing edges, that abut each other over its central region thereby preventing formation of a corresponding thinner central region.

18 Claims, 7 Drawing Sheets

STRUCTURE AND METHOD FOR DUAL GATE OXIDATION FOR CMOS TECHNOLOGY

This application is a divisional of U.S. application Ser. No. 09/173,430 filed Oct. 15, 1998.

FIELD OF THE INVENTION

The present invention relates to a semiconductor integrated circuit, and in particular to a dynamic access memory (DRAM) metal oxide semiconductor field effect transistor (MOSFET) which contains gate oxide regions having various oxide thicknesses that are dependent upon the width of the active device areas. The present invention also provides an improved gate oxidation process useful in fabricating such a DRAM MOSFET structure wherein the gate oxide thickness is determined by the channel width of the MOSFET structure.

BACKGROUND OF THE INVENTION

In current dynamic access memory (DRAM) technologies, the threshold voltage of the device does not scale with the power supply voltage and ground rules because of the non-scalability of the sub-threshold slope. Thus, the minimum gate oxide thickness and/or maximum wordline boost voltage of the array MOSFET is constrained by reliability considerations.

When used for the support MOSFET, the relatively thick gate oxide (having a thickness of greater than ≈6 nm for 0.175 $\mu$m technology) required by the array MOSFET results in degradation in the performance of the MOSFET device. Furthermore, if a thinner gate oxide is used to improve the performance of the support circuitry, charge transfer efficiency in the device array is compromised as a result of the reliability limitation of the wordline boost voltage.

Ideally, in such technology, a dual gate oxide thickness is desired. In the prior art, it is known to subject the DRAM array transistor to a dual gate oxidation process or an alternative gate oxidation process as compared to the support circuitry. These additional gate oxidation processing steps are costly, and they are also yield limiting since one must utilize additional processing steps such as but not limited to: masking, exposure, etching, oxidizing and strip masking, which either grow a second oxide or mask an existing oxide introducing defect sources into the entire structure of the MOSFET device. As such, prior art gate oxidation processes are not reliable nor cost efficient.

In view of the drawbacks mentioned with prior art processes of fabricating DRAM MOSFETs having dual gate oxide thicknesses, a new and improved method of producing such devices using a single gate oxidation step would be beneficial in the semiconductor industry.

SUMMARY OF THE INVENTION

One object of the present invention is to provide a dual gate oxidation process for use in DRAM technologies having feature sizes of about 0.15 $\mu$m or less which does not impose the additional manufacturing steps or costs required by prior gate oxidation processes.

Another object of the present invention is to provide a dual gate oxidation process which provides a path for growing a thicker gate oxide on the DRAM transistor relative to the support transistor allowing for increased gate voltage, reduced vertical electrical field and improved corner reliability to electric field.

A still further object of the present invention is to design a DRAM MOSFET having a minimum ground rule width, to maximize density.

An additional object of the present invention is to provide thicker gate oxide MOSFETs having high current capability suitable for reliable I/O devices capable of interfacing with circuitry external to a semiconductor chip operating at voltages which are higher than on the chip.

These and other objects and advantages are met by utilizing the dual gate oxidation method of the present invention wherein the thickness of the gate oxide is determined, i.e. controlled, by the width of the channel of the MOSFET; narrow width devices having a gate oxide thickness which is greater than those for wide devices. Additionally, the differential in gate oxide thickness may be enhanced in the present invention by decreasing the radius of curvature (increasing sharpness) of the silicon corners.

One aspect of the present invention relates to an integrated circuit, i.e. DRAM MOSFET, which comprises a semiconductor substrate having a plurality of device regions formed therein, said plurality of device regions being electrically isolated from each other by shallow trench isolation (STI) regions, said plurality of device regions each having opposing edges abutting its corresponding STI region;

selected ones of said devices regions having a preselected first device width such that an oxide layer formed thereon includes substantially thicker perimeter regions, along said opposing edges, compared to a thinner central region that does not abut its corresponding STI region; and selected other ones of the device regions having a preselected device width substantially narrower in width than the first device width such that an oxide layer formed thereon includes perimeter regions, along opposing edges, that abut each other over its central region thereby preventing formation of a corresponding thinner central region.

In regard to the object mentioned above concerning thicker gate oxide MOSFETs having high current capabilities, this object is met by providing a plurality of parallel arrayed nested mesa MOSFETs having a narrow width, wherein each narrow MOSFET has a gate oxide which is thicker than the gate oxide of MOSFETs having a mesa with a wider width.

Another aspect of the present invention relates to a dual gate oxidation process which can be used in fabricating the above described integrated circuit. Specifically, the dual gate oxidation process of the present invention comprises the steps of:

(a) forming an oxide pad on a surface of a semiconductor substrate or wafer;

(b) depositing a polish stop layer on top of said oxide pad;

(c) patterning said polish stop layer and oxide pad in predetermined areas wherein active device regions will be formed and developing said pattern:

(d) forming shallow trenches into said semiconductor substrate or wafer;

(e) forming a thermal oxide lining said shallow trenches;

(f) forming a chemical vapor deposited oxide on top of said thermal oxide liner;

(g) planarizing the structure to said polish stop layer;

(h) stripping said polish stop layer and said oxide pad;

(i) forming a sacrificial oxide on the stripped surface under conditions sufficient to produce a predetermined radius of curvature on said semiconductor substrate or wafer;

(j) implanting well regions in said semiconductor substrate or wafer;

(k) stripping said sacrificial oxide; and (l) forming a gate oxide by oxidation, wherein said oxidation is carried out under conditions which are capable of (I) controlling mechanical stresses formed during said oxidation, (II) forming a flowable oxide at corners of active device regions; and (III) forming a gradient in the oxide thickness extending from corners of active device regions to a middle region thereof.

It should be noted that the conditions employed during the gate oxidation step are carefully selected so as to allow flow of the oxide material away from the corners of the device regions. This step, as well as the small feature sizes and radius of curvature of the structure, allows one to obtain the above structure wherein a thicker gate oxide is grown on a narrower portion of the device structure and a thinner gate oxide is grown on the wider portions of the device structure. Such dual oxide gate thicknesses cannot be obtained by prior art processes utilizing a single gate oxidation step.

DETAILED DESCRIPTION OF THE INVENTION

Figure 1:
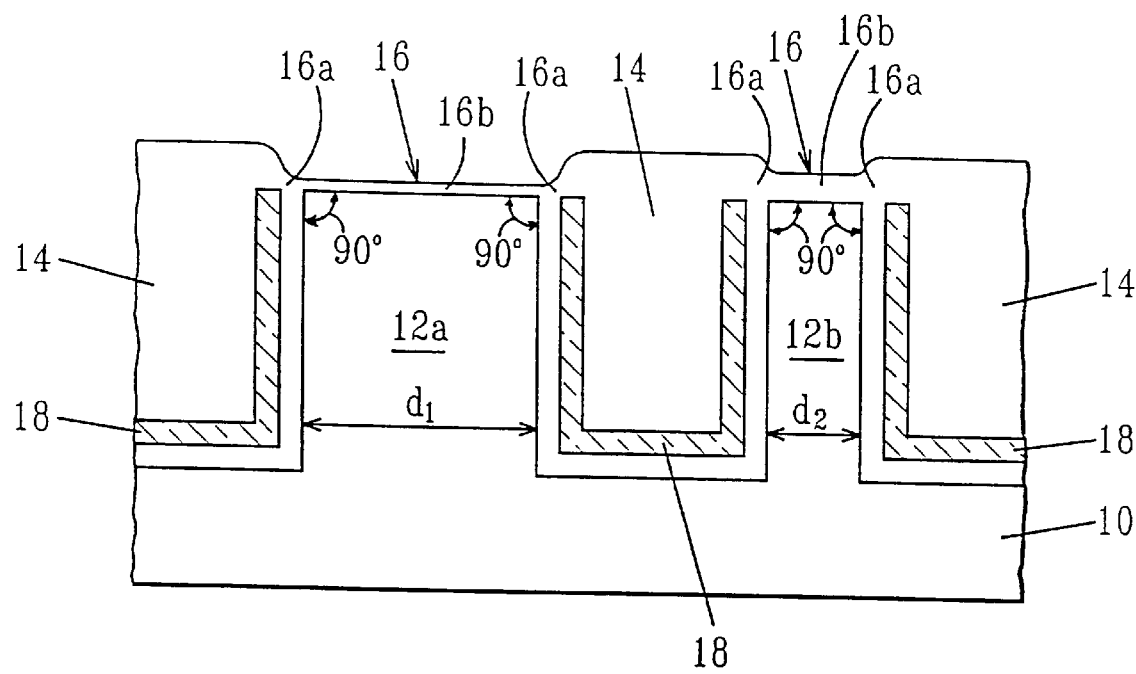
FIG. 1 is a cross-sectional view showing an integrated circuit that can be manufactured using the method of the present invention.

The present invention, which provides a dual gate DRAM MOSFET structure having different gate oxide thicknesses that are determined by the width of the active device regions, will now be described in greater detail with reference to the accompanying drawings wherein like elements or components are referred to by like and corresponding reference numerals.

Figure 2:
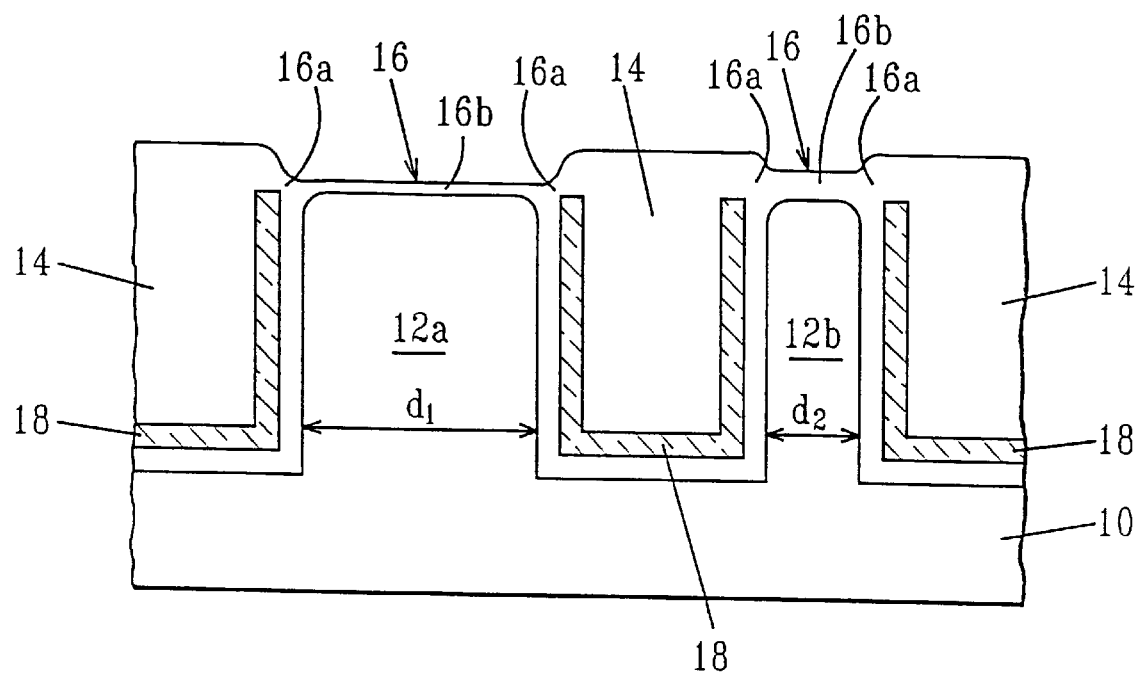
FIG. 2 is a cross-sectional view showing an alternative integrated circuit having a high degree of curvature that can be manufactured using the method of the present invention.

Reference is first made to FIGS. 1 and 2 which are cross-sectional views illustrating integrated circuits (ICs) that can be manufactured using the process of the present invention. The difference in these figures is that in FIG. 1 the active device regions have perfectly sharp 90° corners having little or no radius of curvature. In contrast thereto, the structure shown in FIG. 2 has a radius of curvature which is greater than 0 nm. Preferably, the radius of curvature of the corners of the active device regions is from about 1 to about 30 nm.

Specifically, FIGS. 1 and 2 comprise a semiconductor substrate or wafer 10 having a plurality of active device regions 12 formed in semiconductor substrate 10 (only two of which are illustrated in the drawings). The active device regions 12 are isolated from each other by shallow trench isolation regions (STI) 14 which are also formed in semiconductor substrate 10 and have opposing edges which abut its corresponding STI region. Each active device region comprises source/drain regions which are located perpendicular to the plane of the paper; therefore the source/drain regions are not depicted in the drawings of the present application. As stated above, the active device regions in FIG. 1 have perfectly sharp 90° corners while the active device regions in FIG. 2 have a high degree of curvature associated therewith.

Specifically, the integrated circuit shown in FIG. 1 or 2 comprises a first device region 12a which has a preselected first device width, $d_1$, such that an oxide layer 16 formed thereon, i.e. gate oxide, includes substantially thicker perimeter regions 16a, along opposing edges, compared to a thinner central region 16b that does not abut the corresponding STI region.

The structures shown in FIGS. 1 and 2 also include another device region 12b having a predetermined device width, $d_2$, which is substantially narrower than the device width of device region 12a ($d_1$) such that an oxide layer 16 formed thereon includes perimeter regions 16a, along opposing edges, that abut each other over a central region 16b thereby preventing formation of a thinner central region. Instead, the narrower device width has a thicker oxide region 16 formed thereon as compared to the thinner oxide region 16 which is achieved over the wide device region.

In accordance with the present invention, the wide active device region has a width, $d_1$, that is from about 0.18 to about 20 μm whereas the narrow device region, $d_2$, has a width of from about 0.03 to about 0.15 μm. More preferably, $d_1$ is from about 5 to about 20 μm whereas $d_2$ is from about 0.06 to about 0.12 μm.

The above ranges correlate to a gate oxide that has a thickness of from about 2.5 to about 9.0 nm for $d_1$ and from about 5.0 to about 14.0 nm for $d_2$. More preferably, the preferred ranges correlate to a gate oxide thickness for $d_1$ that is from about 3.0 to about 4.0 nm and a gate oxide thickness for $d_2$ that is from about 5.5 to about 6.5 nm.

The integrated circuits shown in FIGS. 1 and 2 also contain an oxygen barrier, i.e. nitride liner, 18 which is positioned in STI region 14. The oxygen barrier layer is composed of a conventional barrier layer material such as $Si_3N_4$ that is capable of preventing oxygen from diffusing to the semiconductor substrate or wafer. It should be noted that oxygen barrier layer 18 is optional in the present invention. Thus, structures not containing oxygen barrier layer 18 are also within the contemplation of the present invention. While representing an optional embodiment of the present invention, it is noted that the presence of oxygen barrier layer 18 near the active device corners alters the stress pattern such that any oxide grown at the corners is pushed towards the middle of the device mesa. Oxide growing between oxygen barrier layer 18 and device regions 12a and 12b is squeezed by the compressive stress generated in that region. This compressive stress forces the flowable oxide away from the corner. Since oxygen barrier layer 18 is relatively rigid compared to the flowable oxygen it resists deformation. This results in a reactive force which pushes the growing oxide away. The higher the top of the oxygen barrier layer relative to the top of the mesa, the more effective this push. Thus it is important in the present invention to control the etch which removes polish stop layer 19 since this etch also attacks and recesses oxygen barrier layer 18. Overetching should be avoided.

Figure 4:
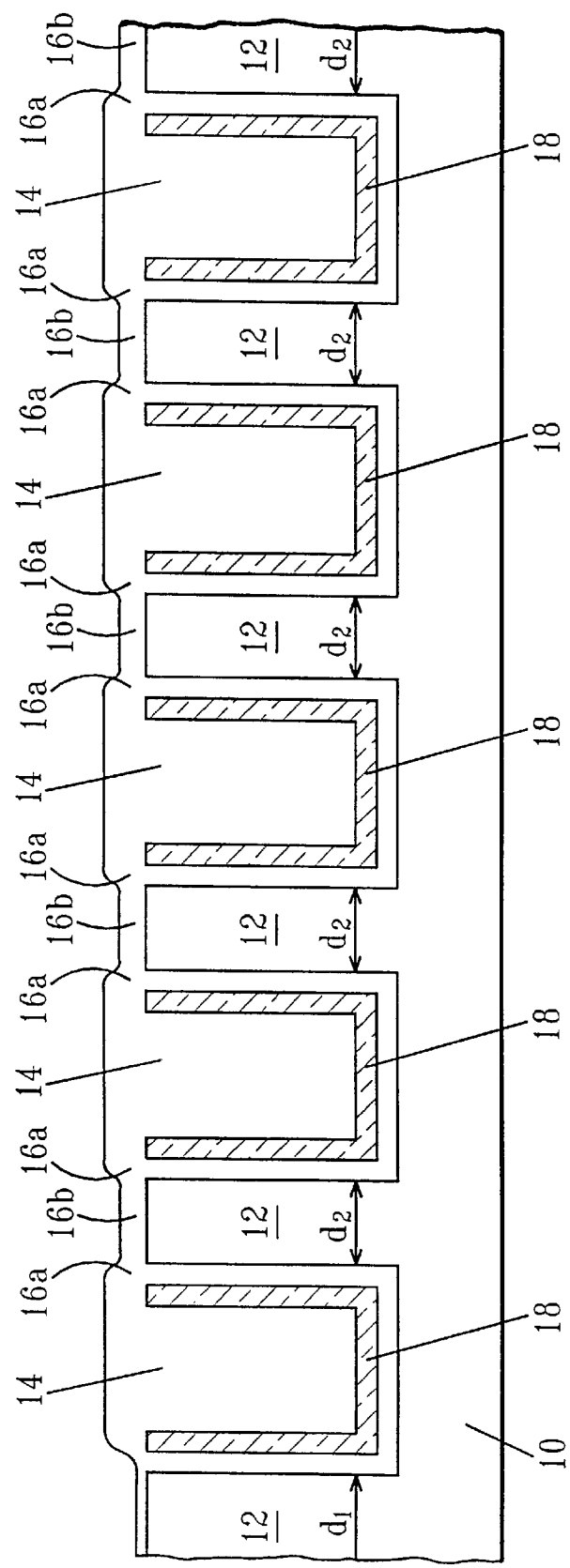
FIG. 4 is a cross-sectional view of a plurality of nested narrow mesa devices in parallel arrangement.

In addition to the structures shown in FIGS. 1 and 2, the present invention is also applicable for forming I/O devices which are capable of interfacing with circuitry external to the semiconductor wafer. Specifically, the present invention can be used to provide thicker gate oxides MOSFETs having high current drive capabilities. This is achieved in the present invention by providing the structure shown in FIG. 4. The structure of FIG. 4 comprises a plurality of nested narrow mesa devices which are arranged in parallel. Specifically, the structure comprises semiconductor substrate or wafer 10 having a plurality of active device regions 12 which are in parallel arrangement and are spaced apart by STI regions 14. The active device regions have a narrow mesa width, $d_2$, associated therewith. A partial segment of an active device region having a wider mesa, $d_1$, is also shown. It is noted that wider mesa, $d_1$, has a thinner oxide region as compared to the oxide region over $d_2$.

It is noted that in the above described drawings the structures are designed by taking into account the minimum ground rule width to exploit the oxide thickness dependence on width. This results in the device being manufactured in a small semiconductor mesa as compared with prior art processes wherein device manufacturing is typically carried out on larger semiconductor mesas.

Figure 5A:
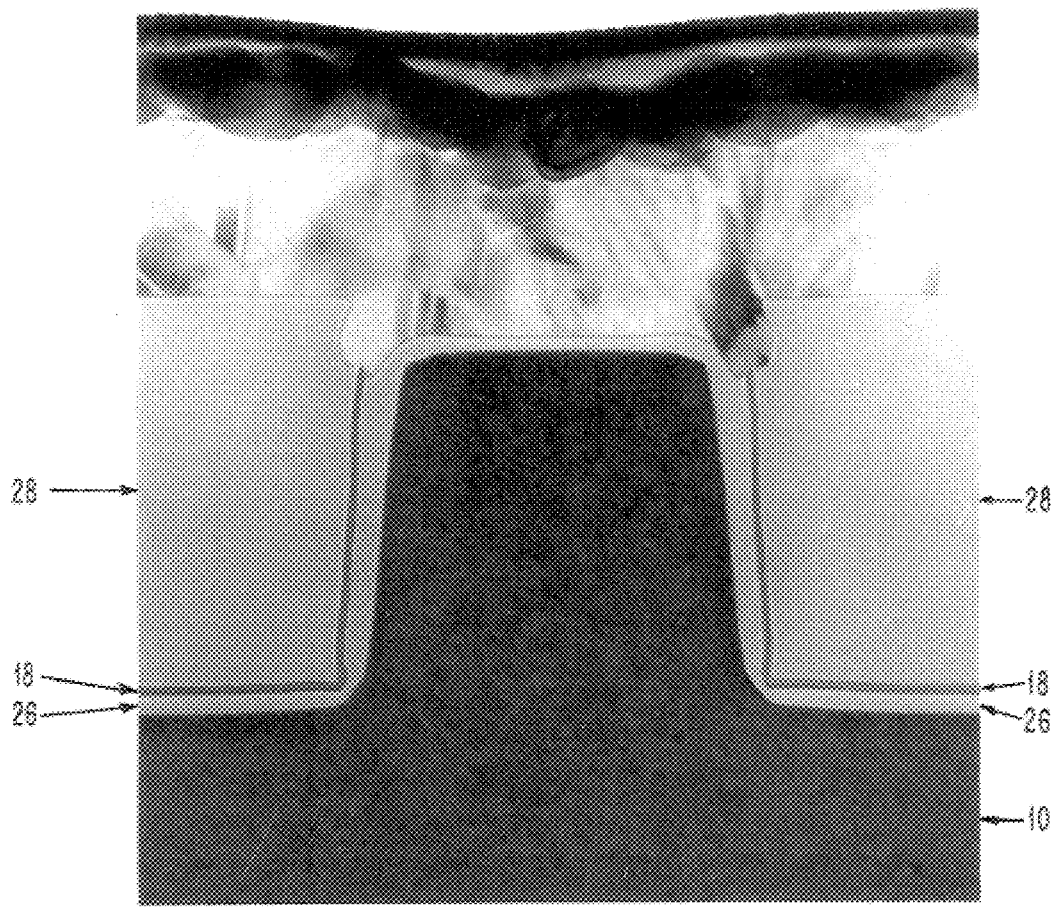
FIGS. 5(a)–(b) are TEM photographs of: (a) 198 nm wide device having a 8 nm gate oxide region; and (b) a 53 nm narrow device having a 12 nm gate oxide region.
Figure 5B:
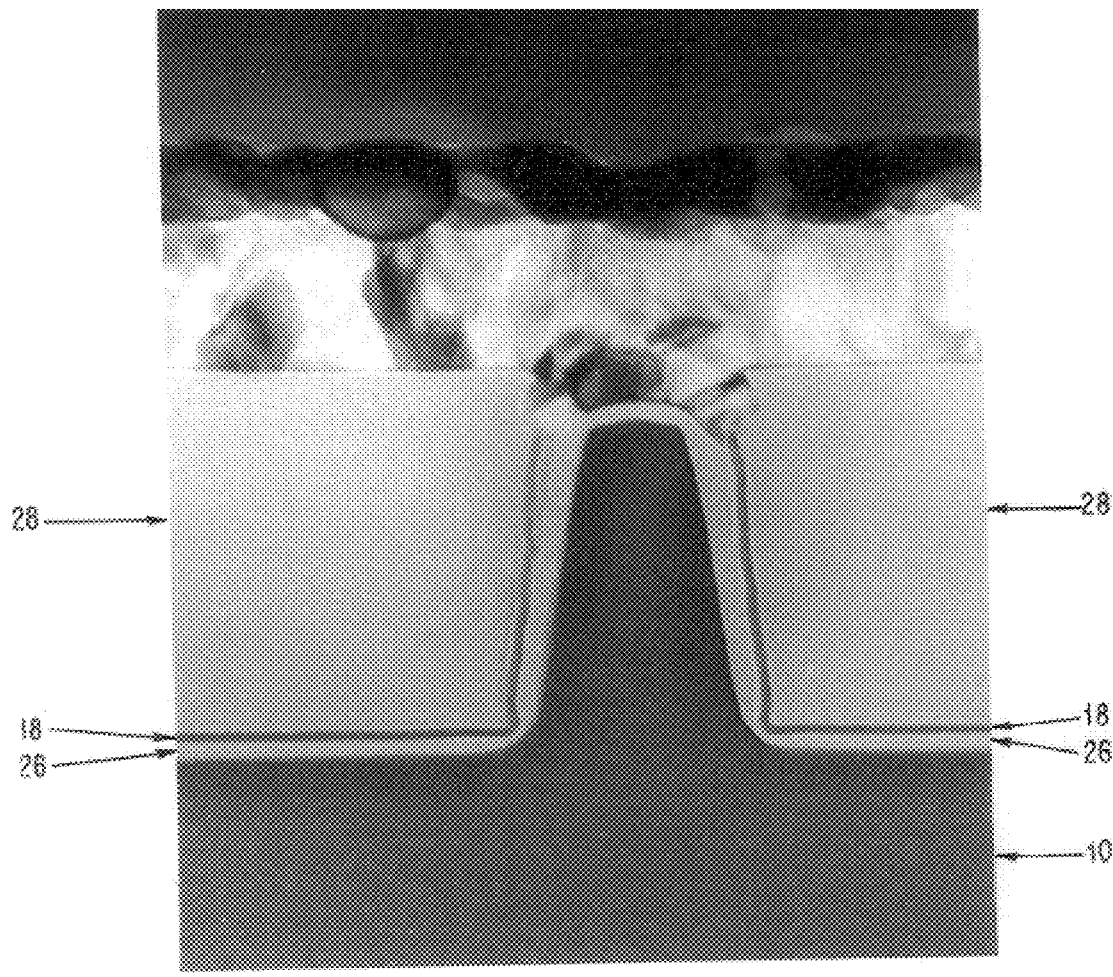

For a better understanding of the present invention, reference is made to FIGS. 5(a)–(b) which are TEM photographs for a device containing a 198 nm wide device region (See FIG. 5(a)) and a device containing a 53 nm wide device region (See FIG. 5(b)). It is noted that for the device shown in FIG. 5(a) the active device region has a gate oxide of about 8 nm formed thereon whereas in FIG. 5(b) the gate oxide over the narrower device region has a thickness of about 12 nm. This demonstrates the basic concept of the present invention that narrower device regions contain a thicker gate oxide as compared to wider device regions which contain thinner gate oxide regions.

The various processing steps utilized in the present invention in manufacturing the structures shown in FIGS. 1, 2, 4 and 5(a)–(b) will now be described in greater detail with reference to FIGS. 3(a)–(g). Attention is first made to FIG. 3(a) which shows the initial structure that is employed in the present invention. It should be emphasized that although these figures contain device regions having sharp 90° corners, the present processing steps are also applicable for producing the structure shown in FIG. 2, i.e. they can be used in manufacturing a structure which contains a high degree of curvature.

Figure 3A:
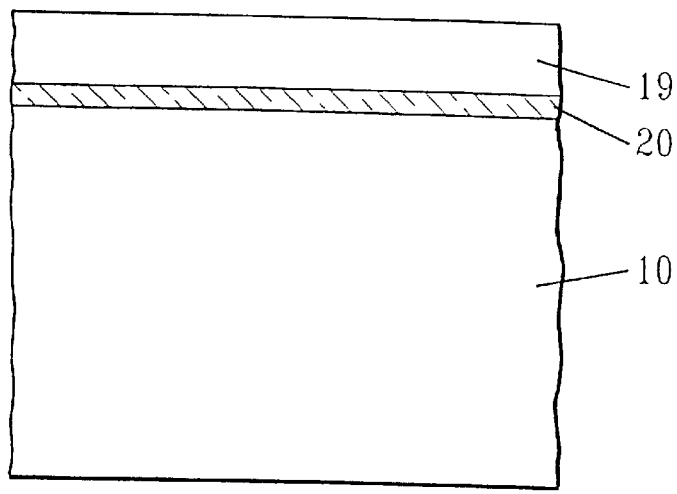
FIGS. 3(a)–(g) are cross-sectional view of the structure of FIG. 1 after various processing steps of the present invention.

Specifically, the initial structure shown in FIG. 3(a) comprises a semiconductor substrate or wafer 10 which has a thin oxide pad 20 formed on its surface and a polish stop layer 19 (i.e. $Si_3N_4$) positioned atop of oxide pad 20. It is noted that the polish stop layer is also referred to in the art as a pad layer.

The semiconductor substrate or wafer 10 is composed of any semiconducting material including, but not limited to: Si, Ge, SiGe, GaAs, InAs, InP and all other III/V compounds. Of these semiconductor materials, it is highly preferred that semiconductor substrate or wafer 10 be composed of silicon. The semiconductor substrate or wafer may be of the p-type or the n-type depending on the type of integrated circuit being manufactured.

Oxide pad 20 is composed of any oxide material such as $SiO_2$ which is capable of being grown thermally or deposited by conventional techniques well known to those skilled in the art. The thickness of the oxide pad layer while not being critical to the present invention is however in the range of from about 3 to about 10 nm. More preferably, oxide pad 20 has a thickness of from about 5 to about 8 nm.

The polish stop layer is composed of any conventional relatively hard material, e.g. $Si_3N_4$, which is capable of slowing the polishing process and it is formed on top of oxide pad 20 utilizing standard deposition techniques and conditions well known to those skilled in the art. For example, chemical vapor deposition, plasma enhanced chemical vapor deposition, plasma vapor deposition, sputtering and other like deposition techniques can be employed in the present invention in forming polish stop layer 19. The thickness of the polish stop layer may vary depending upon the etching and planarization processes employed in the present invention. Typically, however, the thickness of the polish stop layer is from about 50 to about 350 nm. More preferably, the thickness of the layer is from about 100 to about 200 nm.

Figure 3B:
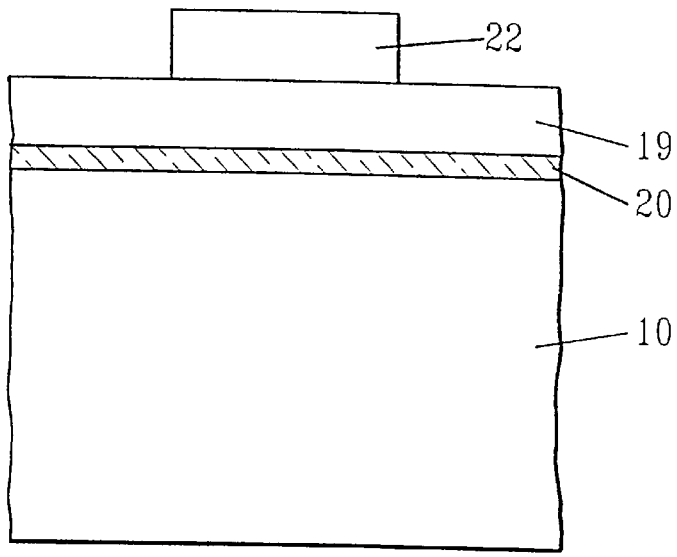

In accordance with the next step of the present invention, active device regions 12 which will contain the MOSFET are predetermined and are formed in the present invention utilizing conventional techniques well known to those skilled in the art. For example, FIG. 3(b) illustrates the employment of a photoresist 22 which is patterned on the surface of polish stop layer or pad 19. After patterning, shallow trenches are formed into semiconductor substrate or wafer 10 utilizing standard etching techniques well known to those skilled in the art. Any anisotropic dry etching technique can be employed in the present invention. Thus, etching may be performed by reactive ion etching, plasma etching and ion beam etching.

Figure 3C:
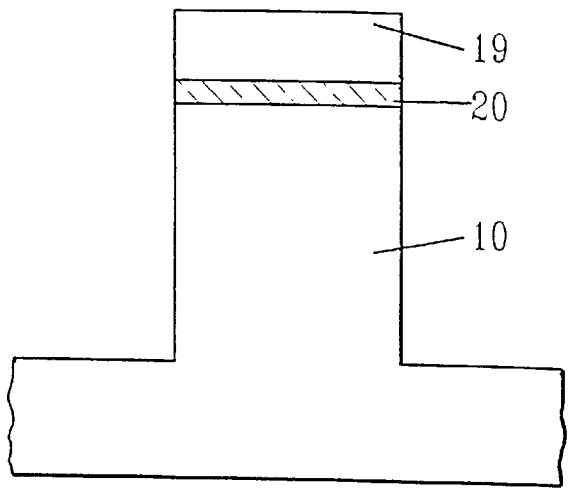

In the present invention, etching is performed to any predetermined depth into the semiconductor substrate or wafer. Typically, depth ranges are from about 0.08 to about 0.6 μm. More preferably, the trenches are etched to a depth of from about 0.15 to about 0.30 μm. The shallow trench etching step is illustrated in FIG. 3(c).

A thermal oxide 26, e.g. $SiO_2$, is grown to line the surface of the shallow trenches utilizing conventional oxidation techniques well known to those skilled in the art. The thermal oxide liner is grown to a thickness that is from about 3 to about 30 nm. More preferably, the thermal oxide has a thickness of from about 5 to about 20 nm.

Figure 3D:
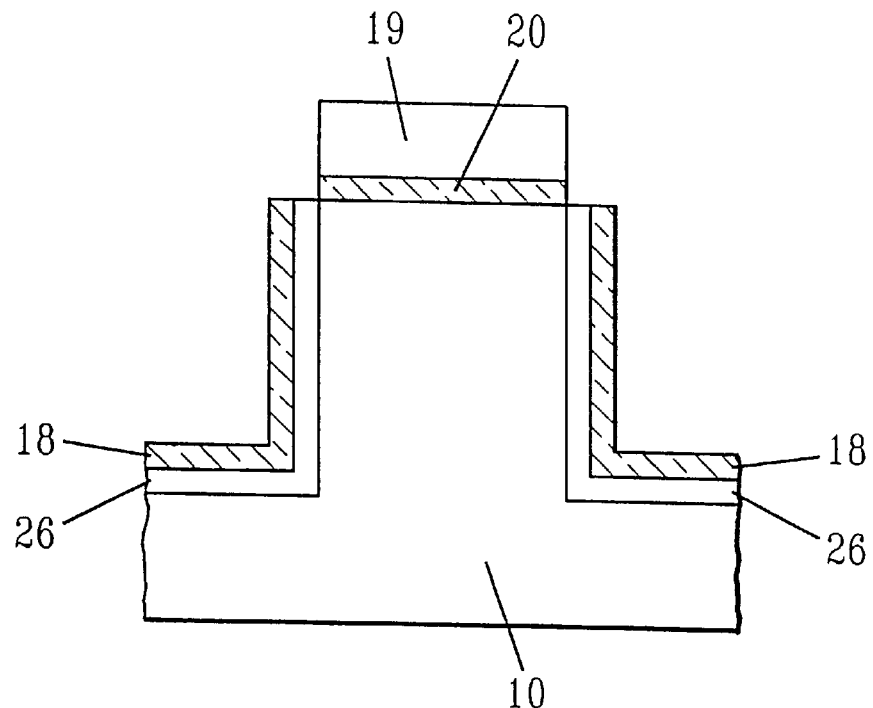

After growing the thermal oxide layer, an optional oxygen barrier layer 18 can be formed on the surface of thermal oxide 26 utilizing the deposition techniques mentioned hereinabove. The thickness of the optional oxygen barrier layer is typically of from about 3 to about 20 nm. More preferably, the optional oxygen barrier layer has a thickness of from about 4 to about 10 nm. The above two steps of the process of the present invention are shown in FIG. 3(d).

Figure 3E:
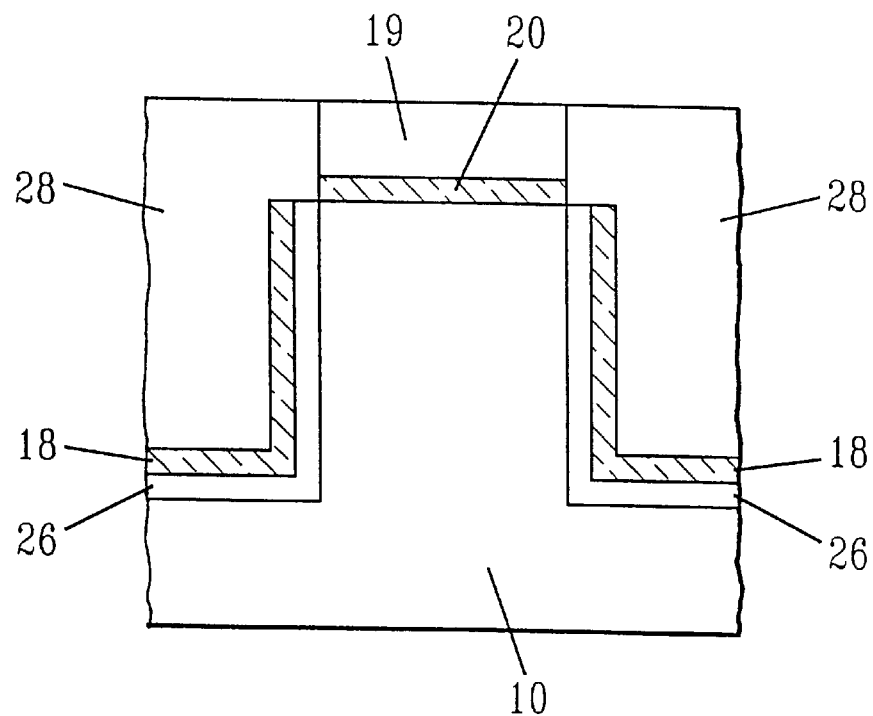
Figure 3F:
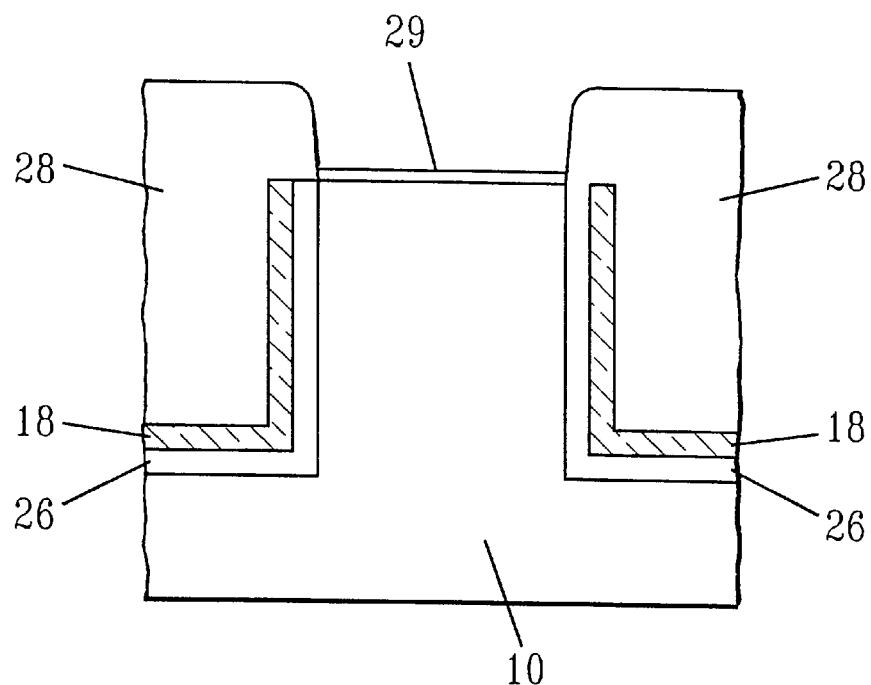

Next, as is shown in FIG. 3(e) a chemical vapor deposited oxide 28 such as tetraethylorthosilicate (TEOS) is formed on the top surface of the structure and the structure is then planarized stopping at polish stop layer 19 using conventional planarization techniques such as chemical mechanical polishing (CMP) or grinding.

The remaining pad layers, i.e. polish stop layer, and oxide pad not covered by the CVD oxide and located over the active device regions are then removed using a chemical etchant such as but not limited to: hot phosphoric acid, followed by buffered HF.

After the above pads layers have been removed, a sacrificial oxide 29 is formed on the exposed surface of the semiconductor substrate under conditions to produce a predetermined radius of curvature in the semiconductor wafer (See, FIG. 3 (f)). This may be carrier out in the present invention by a thermal oxidation step, a step of depositing a sacrificial oxide followed by selective etching or a combination of thermal oxidation and etching.

When thermal growing is employed, conventional oxidation conditions are utilized in the present invention. In one specific case, thermal growing is carried out using a rapid thermal oxidation process in dry $O_2$ at 1050° C. for 35 seconds. On the other hand, when an oxide layer is first deposited, it can be deposited by a selective deposition process well known to those skilled in the art and then etched to provide a predetermined radius of curvature to the structure. Suitable selective etching processes that can be employed in this step of the present invention include: reactive ion etching, plasma etching, ion beam etching, wet and chemical dry etching.

It is emphasized that the formation of the sacrificial oxide layer taken together with the original feature size of the structure as well as the oxidization step mentioned hereinbelow are critical steps in the present invention in being able to form the devices shown in FIGS. 1, 2, 4 and 5(a)–(b). If any one of those features are absent, then the structures provided in FIGS. 1, 2, 4 and 5(a)–(b) cannot be readily obtained.

After these two steps, P-well and N-well doping regions are formed in the surface of the semiconductor substrate utilizing conventional ion implantation techniques and conditions well known by those skilled in the art. N- or p-type dopant atoms may be implanted into the semiconductor substrate or wafer depending on the type of electronic device being manufactured.

Figure 3G:
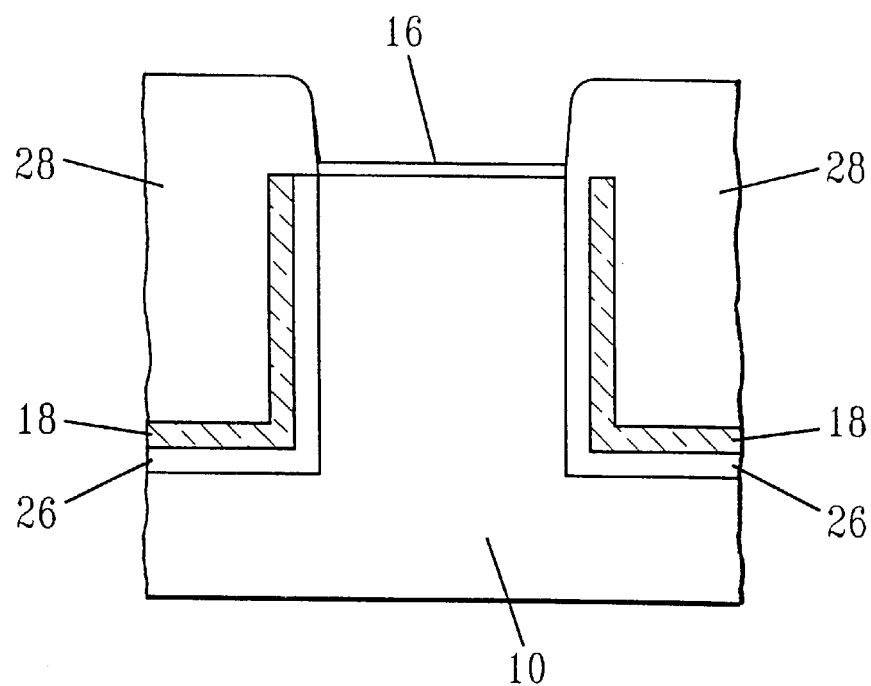

Next, the sacrificial oxide layer is removed using standard etching techniques which preferably utilize fluorine based chemistries. This step of the present invention which does not remove the above obtained radius of curvature introduced into the structure during formation of the sacrificial oxide is shown in FIG. 3(g).

The next step of the present invention is a gate oxidation step. In accordance with the present invention, the gate oxidation step is conducted under defined conditions so that the thickness of the gate oxide 16 formed is a function of the channel width of the MOSFET. Moreover, the oxidation conditions employed in the present invention must be capable of forming an oxide at the corners of the active device regions such that the formed oxide readily flows therefrom.

It is known, see for example, Kao, et al., "Two-dimensional Thermal Oxidation of Silicon-II. Modeling Stress Effects in Wet Oxides" IEEE Trans on Electron Devices, Vol. ED-35 No. 1, January 1988, pp.25–37, that gate oxide thickness dependence on silicon mesa width is influence by: (1) the geometry of the silicon corner to be oxidized, (2) mechanical stress effects produced during the oxidization process, and (3) viscosity of the growing oxide.

For the moment, considering all things being equal (stress components, viscosity, oxidation temperature, time and ambient) oxidization rate is dependent on the silicon corners. For the sake of brevity in this application, the geometry of the corner is characterized by the radius of curvature of the silicon. Numerical calculations by Kao, et al. supra show that oxidation rates increase with decreasing radius of curvature at a convex surface being oxidized. At a convex corner, which is present in the current invention, the supply of oxidants (i.e. dry oxygen, steam plus any other elements introduced to control the electrical and mechanical properties of the oxide) at the interface being oxidized is enhanced with decreasing radius of curvature. The oxidation rate is proportional to the supply oxidants.

Mechanical stresses produced by oxidation at the corners also influences oxidation rate. For the case of a convex corner, a compressive stress normal to the oxidized surface is developed at the oxidized surface by volume expansion which occurs during oxidation. This compressive stress retards the oxidation rate. Therefore, if enhanced oxidation rate is desired at the corners, it is important to select the oxidation conditions such that the developed stress is relaxed by viscous flow of the oxide being grown.

It is also important to allow viscous flow of the oxide such that mechanical stress normal to the surface is reduced (for increased oxidation rate) and also so that the oxide being grown will flow away from the corner (to produce a thicker oxide away from the corner). However, the degree of viscosity flow must be limited in order to establish a gradient in the oxide thickness going away from the corner towards the middle of the mesa. This gradient in oxide thickness is important because it allows the gate oxide thickness to be controlled by the width of the mesa. Therefore, the oxidation conditions employed in the present invention must be selected to produce a desired viscosity.

Specifically, the gate oxidation step employed in the present invention which satisfies all of the above mentioned requirements is carried out in an oxidizing ambient at a temperature of greater than 600° C. but lower than 1100° C. By "oxidizing ambient" it is meant any oxygen containing ambient including, but not limited to: dry oxygen and steam. The gate oxidation step may be carried out under high or low pressures with a preferred range being from about 1 mTorr to about 100 atm. A preferred temperature range is from about 800° to about 1000° C. In a most highly preferred embodiment, the gate oxidation step is carried out by a furnance oxidation process using dry $O_2$. The temperature of the furnance oxidation is ramped up from ambient to 900° C. in $N_2$. At temperature, $N_2$ is replaced with dry $O_2$ and heating is carried out for about 9.5 minutes.

The gate oxidation step of the present invention may be carried out for a period of time of from about 20 seconds to about 60 minutes. More preferably, the oxidation step is carried out for a period of time from about 60 seconds to about 15 minutes. It should be noted that shorter oxidation times are typically employed at higher temperatures whereas longer oxidation times are employed for lower oxidation temperatures.

It is further noted that the present invention takes into account the small feature sizes of the MOS device as well as the fact that oxidation conditions should be controlled within defined limits so as to cause substantial flow of the oxide away from the corners of the active device regions. This allows for the formation of the structures shown in FIGS. 1, 2, 4 and 5(a)–(b) as well as being able to form gate oxides on the MOSFET device having different thicknesses. Such results cannot be obtained in a single oxidation step utilizing prior art gate oxidation methods. Instead, the prior art requires additional processing steps in order to fabricate the same structure. It is again further noted that it is essential that the device being manufactured has small feature sizes (0.15 $\mu$m and below) and a substantial radius of curvature so as to allow sufficient flow of oxide away from the corners of the active device region during the oxidation step.

While this invention has been particularly shown and described with respect to preferred embodiments thereof, it will be understood by those skilled in the art that the foregoing and other changes in form and detail may be made without departing from the spirit and scope of the present invention.

Having thus described our invention in detail, what we claim as new, and desire to secure by the Letters Patent is:

1. A dual gate oxidation method for fabricating an integrated circuit comprising the steps of:

(a) forming an oxide pad on a surface of a semiconductor substrate or wafer;
(b) depositing a polish stop layer on top of said oxide pad;
(c) patterning said polish stop layer and said oxide pad in predetermined areas wherein active device regions will be formed;
(d) forming shallow trenches into said semiconductor substrate or wafer;
(e) forming a thermal oxide lining said shallow trenches;
(f) forming a chemical vapor deposited oxide on top of said thermal oxide liner;
(g) planarizing the structure to said polish stop layer;
(h) stripping said polish stop layer and said oxide pad;
(i) forming a thermal sacrificial oxide on the stripped surface so as to produce a predetermined radius of curvature in said semiconductor substrate or wafer;
(j) forming well doping regions in said semiconductor wafer;
(k) stripping said thermal sacrificial oxide; and
(l) forming a gate oxide by oxidation, wherein said oxidation is carried out so as to form said gate oxide having substantially thicker perimeter regions at corners of said active device regions and an adjoining thinner central region.

2. The dual gate oxidation process of claim 1 wherein said semiconductor substrate or wafer is composed of a semiconducting material selected from the group consisting of Si, Ge, SiGe, GaAs, InAs, InP and other III/V compounds.

3. The dual gate oxidation process of claim 2 wherein said semiconductor substrate or wafer is closed of Si.

4. The dual gate oxidation process of claim 1 wherein said semiconductor substrate or wafer is of the n-type or the p-type.

5. The dual gate oxidation process of claim 1 wherein said oxidation is carried out at a temperature of greater than 600° C. but less than 1100° C.

6. The dual gate oxidation process of claim 5 wherein said gate oxidation step is carried out at a temperature of from about 800° to about 1000° C.

7. The dual gate oxidation process of claim 1 wherein said gate oxidation step is carried out in an oxidizing ambient selected from the group consisting of dry oxygen and steam.

8. The dual gate oxidation process of claim 1 wherein said oxidation step is carried out for a time period of from about 20 seconds to about 60 minutes.

9. The dual gate oxidation process of claim 8 wherein said oxidation step is carried out for a time period of from about 60 seconds to about 15 minutes.

10. The dual gate oxidation process of claim 1 wherein prior to conducting step (f) an oxygen barrier layer is formed on said thermal oxide.

11. The dual gate oxidation process of claim 1 wherein step (i) includes a thermal oxidation process, a deposition and selective etch process or combination of thermal oxidation and etching.

12. The dual gate oxidation process of claim 11 wherein said sacrificial oxide is formed by thermal oxidation using a rapid thermal oxidation process.

13. A method of forming gate oxides on the surface of a semiconductor structure comprising
providing a semiconductor structure having active device regions and requiring gate oxides, said active device regions having various widths and predetermined radii of curvature; and
oxidizing said semiconductor structure, wherein said oxidation is carried out in a single step so as to form said gate oxides each having substantially thicker perimeter regions at corners of said active device regions and an adjoining thinner central region.

14. The method of claim 13 wherein said oxidation step is carried out at a temperature of greater than 600° C. but lower than 1100° C.

15. The method of claim 13 wherein said oxidation step is carried out at a temperature of from about 800° to about 1000° C.

16. The method of claim 13 wherein said oxidization step is carried out in an oxygen-containing atmosphere selected from the group consisting of dry oxygen and steam.

17. The method of claim 13 wherein said oxidation step is carried out for a time period of from about 20 seconds to about 60 minutes.

18. The method of claim 17 wherein said oxidation step is carried out for a time period of from about 60 seconds to about 15 minutes.

* * * * *